(12) United States Patent
Murakami et al.

(10) Patent No.: US 9,123,542 B2
(45) Date of Patent: Sep. 1, 2015

(54) PLASMA ETCHING METHOD

(75) Inventors: Shoichi Murakami, Hyogo (JP); Naoya Ikemoto, Hyogo (JP)

(73) Assignee: SPP Technologies Co., Ltd., Tokyo (JP)

( * ) Notice: Subject to any disclaimer, the term of this patent is extended or adjusted under 35 U.S.C. 154(b) by 0 days.

(21) Appl. No.: 14/237,147

(22) PCT Filed: Aug. 16, 2012

(86) PCT No.: PCT/JP2012/070811
§ 371 (c)(1),
(2), (4) Date: Feb. 4, 2014

(87) PCT Pub. No.: WO2013/035510
PCT Pub. Date: Mar. 14, 2013

(65) Prior Publication Data
US 2014/0187048 A1   Jul. 3, 2014

(30) Foreign Application Priority Data

Sep. 5, 2011 (JP) ................................. 2011-193129

(51) Int. Cl.
*H01L 21/04* (2006.01)
*H01L 21/768* (2006.01)
*H01L 21/3065* (2006.01)
*H01L 21/308* (2006.01)
*H01L 29/16* (2006.01)

(52) U.S. Cl.
CPC ........ *H01L 21/0475* (2013.01); *H01L 21/3065* (2013.01); *H01L 21/3081* (2013.01); *H01L 21/3085* (2013.01); *H01L 21/76813* (2013.01); *H01L 21/76822* (2013.01); *H01L 29/1608* (2013.01)

(58) Field of Classification Search
None
See application file for complete search history.

(56) References Cited

U.S. PATENT DOCUMENTS

| | | | | |
|---|---|---|---|---|
| 4,610,896 A | * | 9/1986 | Veltri et al. .................. | 427/140 |
| 2006/0166482 A1 | * | 7/2006 | Kanamura .................. | 438/623 |
| 2006/0211210 A1 | * | 9/2006 | Bhat et al. .................. | 438/377 |

FOREIGN PATENT DOCUMENTS

| | | |
|---|---|---|
| JP | 02-100318 | 12/1990 |
| JP | 2011-096700 | 12/2011 |

* cited by examiner

*Primary Examiner* — Duy Deo
(74) *Attorney, Agent, or Firm* — Miller, Matthias & Hull LLP

(57) ABSTRACT

A plasma etching method forms a tapered recess portion in a wide-gap semiconductor substrate. The method includes forming on the substrate K an etching film having an etching speed higher than that of the substrate K, and forming a mask M having an opening on the high-speed etching film. The substrate K with the etching film and the mask is then placed on a platen and heated to a temperature equal to or higher than 200 ° C., a plasma is generated from an etching gas supplied into a processing chamber, and a bias potential is applied to the platen to etch substrate.

9 Claims, 6 Drawing Sheets (a)

| | SiH$_4$ (sccm) | NH$_3$ (sccm) | N$_2$ (sccm) | Pressure (Pa) | HF (W) | LF (W) | Refractive index | Side wall angle |
|---|---|---|---|---|---|---|---|---|
| Deposition condition 1 | 5 | 5 | 1000 | 100 | 0 | 100 | 1.882 | 67.2 |
| Deposition condition 2 | 5 | 5 | 1000 | 100 | 100 | 0 | 1.879 | 60.0 |
| Deposition condition 3 | 20 | 5 | 1000 | 100 | 100 | 0 | 2.296 | 58.2 |
| Deposition condition 4 | 20 | 0 | 1000 | 100 | 100 | 0 | 2.600 | 53.7 |

FIG. 7

| a-Si thickness (μm) | 0 | 0.1 | 0.3 | 0.5 |
|---|---|---|---|---|
| Deposition time (min) | 0 | 0.88 | 2.65 | 4.42 |
| Side wall angle (deg) | 74.7 | 73.4 | 73.2 | 73.0 |

PLASMA ETCHING METHOD

CROSS-REFERENCE TO RELATED APPLICATIONS

This application is a U.S. National Stage filing under 35 USC §371 of International Patent Application No. PCT/JP2012/070811 filed on Aug. 16, 2012. This application also claims priority under the Paris Convention to Japanese Application No. 2011-193129, filed on Sep. 5, 2011.

FIELD OF THE DISCLOSURE

The present invention relates to a plasma etching method of plasma etching a wide-gap semiconductor substrate, and in particular relates to a plasma etching method of forming a tapered trench or hole in a wide-gap semiconductor substrate.

BACKGROUND ART OF THE DISCLOSURE

In recent years, a wide-gap semiconductor substrate has attracted much attention as a semiconductor material. Because a wide-gap semiconductor substrate has the feature of having a small crystal lattice constant and a large band gap as compared with a silicon substrate and a gallium arsenide (GaAs) substrate which are conventionally widely used, and therefore has good physical properties, it is expected to be applied to fields which cannot be covered by a silicon substrate or a GaAs substrate. The wide-gap semiconductor substrate generally comprises a compound including an element in the second period of the periodic table of the elements, such as carbon (C), nitrogen (N) and oxygen (O), and, as examples thereof, mention may be made of silicon carbide (SiC), zinc oxide (ZnO), and the so-called group III-V compounds such as gallium nitride (GaN), aluminum nitride (AlN), boron nitride (BN) and boron phosphide (BP).

However, as described above, silicon carbide or the like which is used as a wide-gap semiconductor substrate has a small crystal lattice constant as compared with silicon or the like, that is, has a strong interatomic bond, and therefore a silicon carbide substrate has the disadvantage that it has a difficulty in being etched as compared with a silicon substrate because it is difficult to break the interatomic bond. Therefore, as a method of plasma etching such a wide-gap semiconductor substrate, the applicant have suggested the plasma etching method disclosed in the Japanese Unexamined Patent Application Publication No. 2011-096700.

In this plasma etching method, the object to be etched is a substrate having a structure in which a silicon dioxide ($SiO_2$) film as mask is formed on a silicon carbide substrate which is a type of wide-gap semiconductor substrate, an inert gas such as He gas is supplied into a processing chamber and plasma is generated from the inert gas, thereby generating ions coming from the inert gas, and a bias potential is applied to a platen on which the silicon carbide substrate is placed to make the generated ions incident on the silicon carbide substrate, thereby heating the silicon carbide substrate to a predetermined etching temperature within a range of 200° C. to 400° C. Thereafter, an etching gas such as $SF_6$ is supplied into the processing chamber and plasma is generated from the etching gas, thereby generating ions and reactive species, and a bias potential is applied to the platen and thereby the silicon carbide substrate is etched by sputtering by the generated ions and by a chemical reaction with radicals in a state where the temperature of the silicon carbide substrate is maintained at the etching temperature.

According to this plasma etching method, it is possible to supply part of the energy necessary for breaking the bonds between the silicon (Si) and the carbon (C) which form the silicon carbide substrate by heating the silicon carbide substrate placed on the platen to a predetermined etching temperature, and this makes it easy to break the interatomic bonds of the silicon carbide substrate, and therefore the silicon carbide substrate can be easily etched, and further can be etched with high accuracy.

SUMMARY OF THE DISCLOSURE

By the way, a trench, hole or the like (hereinafter, referred to as a "recess portion") which is a structure formed in a semiconductor substrate by etching is, for example, filled with metal in a later step to form a circuit. At this time, if the recess portion has a shape difficult to fill tightly with metal, for example, a bowing shape, a defect occurs in the circuit due to the fact that the recess portion is not filled tightly with metal, which leads to the occurrence of a problem such as defective conduction. Therefore, it is preferred that the recess portion has a shape easy to fill tightly with metal, for example, a tapered shape.

However, when etching a silicon carbide substrate by the above-mentioned conventional plasma etching method, a recess portion having a bowing shape was formed and it was not possible to form a taped recess portion. This was supposed to be caused by the following reasons.

When etching a silicon carbide substrate by the above-mentioned conventional plasma etching method, since the interatomic bonds can be easily broken as described above, isotropic etching by a chemical reaction with reactive species such as radicals easily proceeds. However, in a portion just under the mask of the silicon carbide substrate, there is little contact between the silicon carbide substrate and the reactive species and therefore isotropic etching hardly proceeds. Further, while a portion in the vicinity of the portion just under the mask is hardly sputtered by the ions, other portions (particularly, a central portion of the side wall of the recess portion) is easily etched by the sputtering by the ions, and therefore, etching proceeds more slowly in the portion in the vicinity of the portion just under the mask than in other portions. Therefore, it is conceivable that the recess portion formed in the silicon carbide substrate has the so-called bowing shape as mentioned above.

The present invention has been achieved in view of the above-described circumstances and an object thereof is to provide a plasma etching method capable of easily performing etching with high accuracy and forming a tapered recess portion in a wide-gap semiconductor substrate and a plasma etching method also capable of causing the recess portion to have a desired taper angle.

The present invention, for achieving the above-described object, relates to a plasma etching method of plasma etching a wide-gap semiconductor substrate placed on a platen arranged in a processing chamber using a plasma generated from a reactive etching gas, comprising a deposition step of forming a high speed etching film on a surface of the wide-gap semiconductor substrate, the high speed etching film comprising a component which is etched at a higher speed than a component of the wide-gap semiconductor by reactive species generated by generating the plasma from the reactive etching gas, a mask forming step of forming a mask having an opening on the high speed etching film formed on the surface of the wide-gap semiconductor substrate; and an etching step of placing the wide-gap semiconductor substrate on the platen arranged in the processing chamber, heating the wide-gap semiconductor substrate to a temperature equal to or higher than 200° C., and supplying the reactive etching gas into the processing chamber to generate the plasma and applying a bias potential to the platen on which the wide-gap semiconductor substrate is placed, thereby etching, through the opening, the high speed etching film and the wide-gap semiconductor substrate by the plasma generated from the reactive etching gas.

According to the present invention, for plasma etching a wide-gap semiconductor substrate, first, a high speed etching film is formed on a surface of the wide-gap semiconductor substrate, the high speed etching film comprising a component which is etched by a chemical reaction with reactive species at a higher speed than a component of the wide-gap semiconductor substrate. It is noted that, as for the reactive etching gas, mention may be made of a fluorine-containing gas and a chlorine-containing gas.

Subsequently, a mask having an opening is formed on the high speed etching film formed on the surface of the wide-gap semiconductor substrate.

Then, the wide-gap semiconductor substrate having the high speed etching film and the mask formed thereon is placed on the platen and is heated to a temperature equal to and higher than 200° C., and a reactive etching gas is supplied into the processing chamber to generate a plasma and a bias potential is applied to the platen on which the wide-gap semiconductor substrate is placed, thereby etching the wide-gap semiconductor substrate and the high speed etching film by the plasma generated from the reactive etching gas. It is noted that it is preferable that the temperature to which the wide-gap semiconductor substrate is heated is between 200° C. and 1000° C.

Hereinafter, a process of forming a tapered recess portion in the wide-gap semiconductor substrate is described with reference to FIG. 1. It is noted that, in FIG. 1, the wide-gap semiconductor substrate, the high speed etching film and the mask are indicated by references K, E and M, respectively.

First, as shown in FIG. 1(*a*), the E1 portion of the high speed etching film E is etched by sputtering by ions generated by generating the plasma from the reactive etching gas and by a chemical reaction with the reactive species, and the E2 portion of the high speed etching film E is etched by the chemical reaction with the reactive species. Thereby, the K1 portion of the wide-gap semiconductor substrate K is exposed and the K2 portion located under the mask is also exposed.

Subsequently, as shown in FIG. 1(*b*), the K1 portion of the wide-gap semiconductor substrate K which has been exposed by the etching of the E1 portion of the high speed etching film E is etched. Further, because the etching speed of the high speed etching film E is higher than that of the wide-gap semiconductor substrate K, the E2 portion is etched faster than the K3 portion which is a side wall of the wide-gap semiconductor substrate K. Thereby, the K2 portion of the wide-gap semiconductor substrate K is further exposed and the reactive species enter between the K2 portion and the Mask M, and thereby isotropic etching of the K2 portion proceeds.

Thereafter, as shown in FIG. 1(*c*), the etching of the K1 portion of the wide-gap semiconductor substrate K proceeds in a similar manner. Further, because the etching of the E2 portion of the high speed etching film E proceeds, the K2 portion of the wide-gap semiconductor substrate K, which has been covered by the high speed etching film E, is gradually exposed and further the K2 portion is gradually etched isotropically.

As the K2 portion of the wide-gap semiconductor substrate K is etched, the K1 portion is also etched, and finally a tapered recess portion (etching structure) is formed as shown in FIG. 1(*d*).

Thus, in the plasma etching method of the present invention, since a high speed etching film which is easier to etch than a wide-gap semiconductor substrate and the etching speed of which is higher than that of the wide-gap semiconductor substrate is formed between the wide-gap semiconductor substrate and a mask, a clearance is formed between the wide-gap semiconductor substrate and the mask by etching of the high speed etching film, and reactive species generated by generating a plasma from a reactive etching gas enter the clearance and thereby a portion located under the mask of the wide-gap semiconductor substrate is etched, thereby making it possible to form a tapered recess portion. It is noted that the word "tapered" in the present application means that a recess portion has an opening having a width larger than that of the bottom thereof and has an almost straight side wall. Further, in the present application, as shown in FIG. 1(*d*), the angle θ between the bottom surface and the side wall surface of a recess portion is defined as a "taper angle".

It is noted that, as for the wide-gap semiconductor substrate, a silicon carbide substrate may be given as an example, but the wide-gap semiconductor substrate is not limited thereto and may comprise, for example, zinc oxide (ZnO) or the so-called group III-V compound such as gallium nitride (GaN), aluminum nitride (AlN), boron nitride (BN) and boron phosphide (BP).

Further, in a case where the wide-gap semiconductor substrate is a silicon carbide substrate, it is preferable that the reactive etching gas is a fluorine-containing gas. It is noted that $SF_6$ gas and $CF_4$ gas may be given as examples of fluorine-containing gas.

Furthermore, in a case where the wide-gap semiconductor substrate is a silicon carbide substrate and the wide-gap semiconductor substrate is etched using a fluorine-containing gas, it is preferable that the high speed etching film comprises at least one among titanium-containing materials, such as titanium (Ti) and titanium nitride (TiN), and silicon-containing materials, such as tungsten silicide (WSi), amorphous silicon (α-Si), polysilicon (p-Si) and silicon nitride ($SixNy$), and the high speed etching film may be a single-layer film or a multilayer film selected from these materials.

In this case, because titanium, titanium nitride, tungsten silicide, amorphous silicon, polysilicon and silicon nitride differ in the etching speed, it is possible to change the ratio of the etching speed of the wide-gap semiconductor substrate (silicon carbide substrate) to the etching speed of the high speed etching film by the material selection of high speed etching film. Thereby, the shape of the recess portion formed in the wide-gap semiconductor substrate can be changed.

It is noted that the high speed etching film is not limited to titanium, titanium nitride, tungsten silicide, amorphous silicon, polysilicon and silicon nitride. In the case where the wide-gap semiconductor substrate comprises zinc oxide or the group III-V compound such as gallium nitride, aluminum nitride, boron nitride and boron phosphide, and in the case where a chlorine-containing gas is used as the reactive etching gas, the component of the high speed etching film may be selected as appropriate so that the etching speed of the high speed etching film is higher than that of the wide-gap semiconductor substrate.

Further, the deposition step is preferably performed by the so-called vapor deposition. The vapor deposition includes the chemical vapor deposition and the physical vapor deposition, which are known to the public.

Further, in the present invention, the high speed etching film can be deposited under deposition conditions which are set in accordance with the angle (taper angle) of the side wall surface to the bottom surface of the etching structure to be formed in the etching step.

According to the inventors' knowledge, as for the high speed etching film, even if the material thereof is the same, the film quality of the deposited high speed etching film varies depending on deposition conditions, such as the supply flow rate of a source gas for deposition supplied into a process chamber, the supply flow rate of a carrier gas supplied into the process chamber, the pressure inside process chamber, the power applied to electrode, etc., and therefore the speed of etching the high speed etching film by the reactive species varies. Therefore, by adjusting such deposition conditions, it is possible to change, for example, the bonding state of the high speed etching film, and thereby vary the degree of etching and the etching speed, and accordingly it is possible to vary the taper angle of the side wall surface of the recess portion.

Therefore, it is possible to set deposition conditions corresponding to the taper angle of the side wall surface to be formed in the etching step, and depositing the high speed etching film under such deposition conditions in the deposition step makes the taper angle of the side wall surface formed in the etching step a desired angle.

It is noted that, when adjusting the deposition conditions, it is preferable that at least one of the supply flow rate of source gas, the supply flow rate of carrier gas, the pressure inside process chamber and the power applied to electrode, which are mentioned above, is adjusted.

Further, according to the inventors' knowledge, in a case where the high speed etching film comprises at least one of amorphous silicon, polysilicon, tungsten silicide and silicon nitride, the high speed etching film has translucency and the difference of the film quality can be regarded as the difference of refractive index.

Therefore, it is possible to set deposition conditions which enables depositing the high speed etching film so as to have a film quality, in other words, a refractive index corresponding to the taper angle of the side wall surface to be formed in the etching step, and depositing the high speed etching film under such deposition conditions in the deposition step makes it possible to deposit a high speed etching film having a desired refractive index, and accordingly it is possible to make the taper angle of the side wall surface formed in the etching step a desired angle.

Furthermore, according to the inventors' another knowledge, the taper angle of the side wall surface formed in the etching step depends on the film thickness of the high speed etching film. That is, as the film thickness of the high speed etching film becomes larger, a space formed between the top surface of the wide-gap semiconductor substrate and the mask by etching the high speed etching film becomes larger, and therefore the reactive species can easily enter the space and isotropic etching of the wide-gap semiconductor substrate there proceeds more quickly, and thereby the taper angle of the side wall surface becomes smaller.

Therefore, causing the high speed etching film to have a film thickness set corresponding to the taper angle of the side wall surface to be formed in the etching step makes it possible to make the taper angle of the side wall surface formed in the etching step a desired angle.

As described above, according to the plasma etching method of the present invention, it is possible to, without lowering the easiness of etching, prevent the recess portion formed in the wide-gap semiconductor substrate from having a bowing shape and cause the recess portion to have a tapered shape. Further, it is possible to make the taper angle of the side wall surface of the recess portion a desired angle.

BRIEF DESCRIPTION OF DRAWINGS

FIG. 6 is a table showing the refractive index of a silicon nitride film when changing deposition conditions and showing a tapered side wall angle of a tapered shape which is etched using the silicon nitride film as high speed etching film; and FIG. 7 is a table showing a tapered side wall angle of a tapered shape which is etched using an amorphous silicon (a-Si) film as high speed etching film, wherein the film thickness of the amorphous silicon film is changed between 0 μm and 0.5 μm.

DETAILED DESCRIPTION (First Embodiment)

Hereinafter, a specific embodiment of the present invention will be described with reference to the accompanying drawings. It is noted that, in this embodiment, a case where a silicon carbide substrate K which is a type of wide-gap semiconductor substrate is plasma etched using an etching apparatus 1 is described as an example. Additionally, the silicon carbide substrate K shall have a crystal structure of 4H-SiC, for example.

Figure 2:
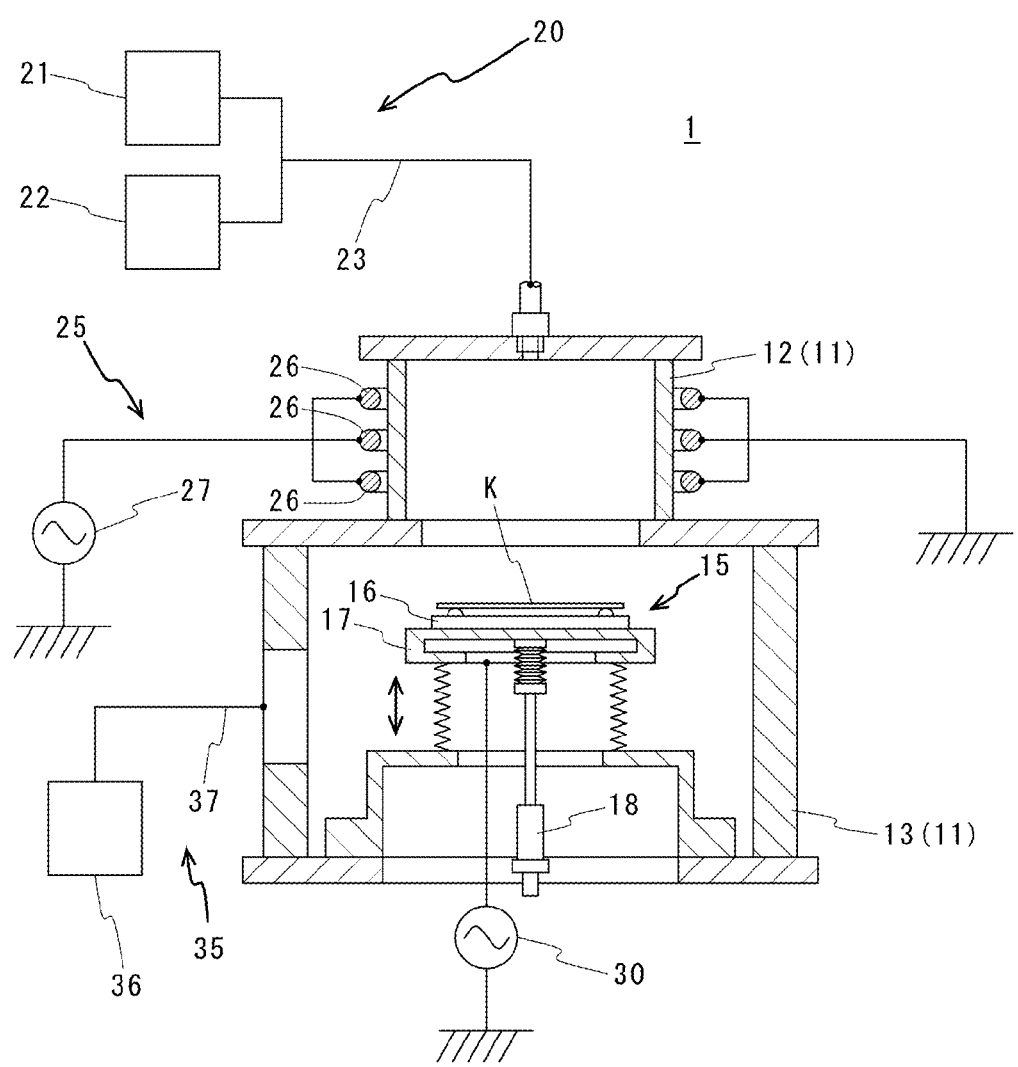
FIG. 2 is a cross-sectional view showing a schematic configuration of an etching apparatus for performing a plasma etching method according to one embodiment of the present invention.

First of all, the etching apparatus 1 is described with reference to FIG. 2. The etching apparatus 1 has a processing chamber 11 having a closed space, a platen 15 which is disposed in the processing chamber 11 to be vertically movable and on which the silicon carbide substrate K is placed, a lifting cylinder 18 lifting up and down the platen 15, a gas supply device 20 supplying an etching gas and an inert gas into the processing chamber, a plasma generating device 25 generating plasma from the etching gas and the inert gas supplied into the processing chamber, a high-frequency power supply unit 30 supplying high-frequency power to the platen 15, and an exhaust device 35 reducing the pressure inside the processing chamber 11.

The processing chamber 11 comprises an upper chamber 12 and a lower chamber 13 which have their respective inner spaces communicating with each other, and the upper chamber 12 is formed to be smaller than the lower chamber 13. Further, the platen 15 comprises an upper member 16 on which the silicon carbide substrate K is placed and a lower member 17 to which the lifting cylinder 18 is connected, and is arranged in the lower chamber 13.

The gas supply device 20 has an etching gas supply section 21 which supplies, for example, $SF_6$ gas or gas mixture of $SF_6$ gas and $O_2$ gas as a reactive etching gas, an inert gas supply section 22 which supplies an inert gas, for example, He gas as a carrier gas, and a supply pipe 23 one end of which is connected to the top surface of the upper chamber 12 and the other end of which is branched and connected to the etching gas supply section 22 and the inert gas supply section 22, and the etching gas is supplied into the processing chamber 11 from the etching gas supply section 22 through the supply pipe 23 and the inert gas is supplied into the processing chamber 11 from the inert gas supply section 22 through the supply pipe 23.

The plasma generating device 25 is a device generating the so-called inductively coupled plasma (ICP), comprises a plurality of annular coils 26 vertically aligned on the outer peripheral surface of the upper chamber 12 and a high-frequency power supply unit 27 supplying high-frequency power to the coils 26, and generates plasma from the etching gas and the inert gas supplied into the upper chamber 12 by causing the high frequency power supply unit 27 to supply high-frequency power to the coils 26. Further, the high-frequency power supply unit 30 applies a bias potential to between the platen 15 and the plasma by supplying high-frequency power to the platen 15, thereby making ions generated by generating the plasma from the etching gas and inert gas incident on the silicon carbide substrate K placed on the platen 15.

The exhaust device 35 comprises a vacuum pump 36 exhausting gas, and an exhaust pipe 37 one end of which is connected to the vacuum pump 36 and the other end of which is connected to a side surface of the lower chamber 13, and the vacuum pump 36 exhausts the gas inside the processing chamber 11 through the exhaust pipe 37 and maintains the pressure inside the processing chamber 11 at a predetermined pressure.

Next, a method of plasma etching the silicon carbide substrate K using the etching apparatus 1 having the above-described configuration is described.

Before plasma etching the silicon carbide substrate K using the etching apparatus 1, first, a high speed etching film forming processing and a mask forming processing are performed on the silicon carbide substrate K using a not shown appropriate device.

First, the high speed etching film forming processing is performed on the silicon carbide substrate K. By this high speed etching film forming processing, a high speed etching film E which is etched at a higher etching speed than the silicon carbide substrate K is formed on a surface of the silicon carbide substrate K by a vapor deposition (chemical vapor deposition (CVD) or physical vapor deposition (PVD)) or the like. It is noted that, as for the high speed etching film E, titanium-containing materials such as titanium and titanium nitride can be given as examples of the material thereof, but it is not limited thereto and silicon-containing materials such as tungsten silicide, amorphous silicon, polysilicon and silicon nitride may be used, and the high speed etching film E may be a single-layer film or a multilayer film selected from these materials. Further, as described in detail later, it is possible to change the ratio of the etching speed of the silicon carbide substrate K and the etching speed of the high speed etching film E by the material selection of high speed etching film, thereby changing the shape of a recess portion formed in the silicon carbide substrate K. Furthermore, even when the wide-gap semiconductor substrate comprises another component, for example, gallium nitride or aluminum nitride, the components of the high speed etching film E may be selected as appropriate so that it is etched at a higher etching speed than the substrate.

Subsequently, the mask forming processing is performed on the silicon carbide substrate K having the high speed etching film E formed thereon. By this mask forming processing, a mask M is formed on the high speed etching film E formed on the silicon carbide substrate K, for example, by the above-mentioned vapor deposition or the like, and then a predetermined mask pattern having an opening is formed on the mask M. It is noted that, although the mask M comprises nickel (Ni) in this embodiment, the mask M is not limited thereto and may comprise another metal mask or silicon dioxide, for example.

Thereafter, a plasma etching processing is performed on the silicon carbide substrate K on which the high speed etching film E and the mask M have been formed as described above.

First, the silicon carbide substrate K is loaded into the etching apparatus 1 and placed on the platen 15, and is heated to a predetermined etching temperature within a temperature range between 200° C. and 1000° C. Specifically, an inert gas is supplied into the processing chamber 11 from the inert gas supply section 22 and high-frequency power is applied to the coils 26 and the platen 15 by the high-frequency power supply units 27, 30, respectively. A plasma is generated from the inert gas supplied into the processing chamber 11 by the application of high-frequency power to the coils 26, and ions generated by the generation of plasma are made incident on the silicon carbide substrate K placed on the platen 15 by a bias potential generated by the application of high-frequency power to the platen 15, and collide therewith. Thereby, the silicon carbide substrate K absorbs energy of the ions colliding therewith and the temperature of the silicon carbide substrate K is increased, and the silicon carbide substrate K eventually reaches the equilibrium state at the etching temperature. It is noted that the pressure inside the processing chamber 11 is maintained at a predetermined pressure by the exhaust device 35.

Next, after the temperature of the silicon carbide substrate K reaches the equilibrium state at the etching temperature, the silicon carbide substrate K is etched using the mask M as mask. Specifically, a reactive etching gas is supplied into the processing chamber 11 from the etching gas supply section 21 and high-frequency power is applied to the coils 26 and the platen 15 by the high-frequency power supply units 27, 30, respectively. Thereafter, a plasma is generated from the etching gas supplied into the processing chamber 11 by the application of high-frequency power to the coils 26, and the high speed etching film E and the silicon carbide substrate K are etched by ions and reactive species generated by the generation of plasma, thereby forming a tapered recess portion in the silicon carbide substrate K. It is noted that the pressure inside the processing chamber 11 is maintained at a predetermined pressure by the exhaust device 35.

Figure 1:
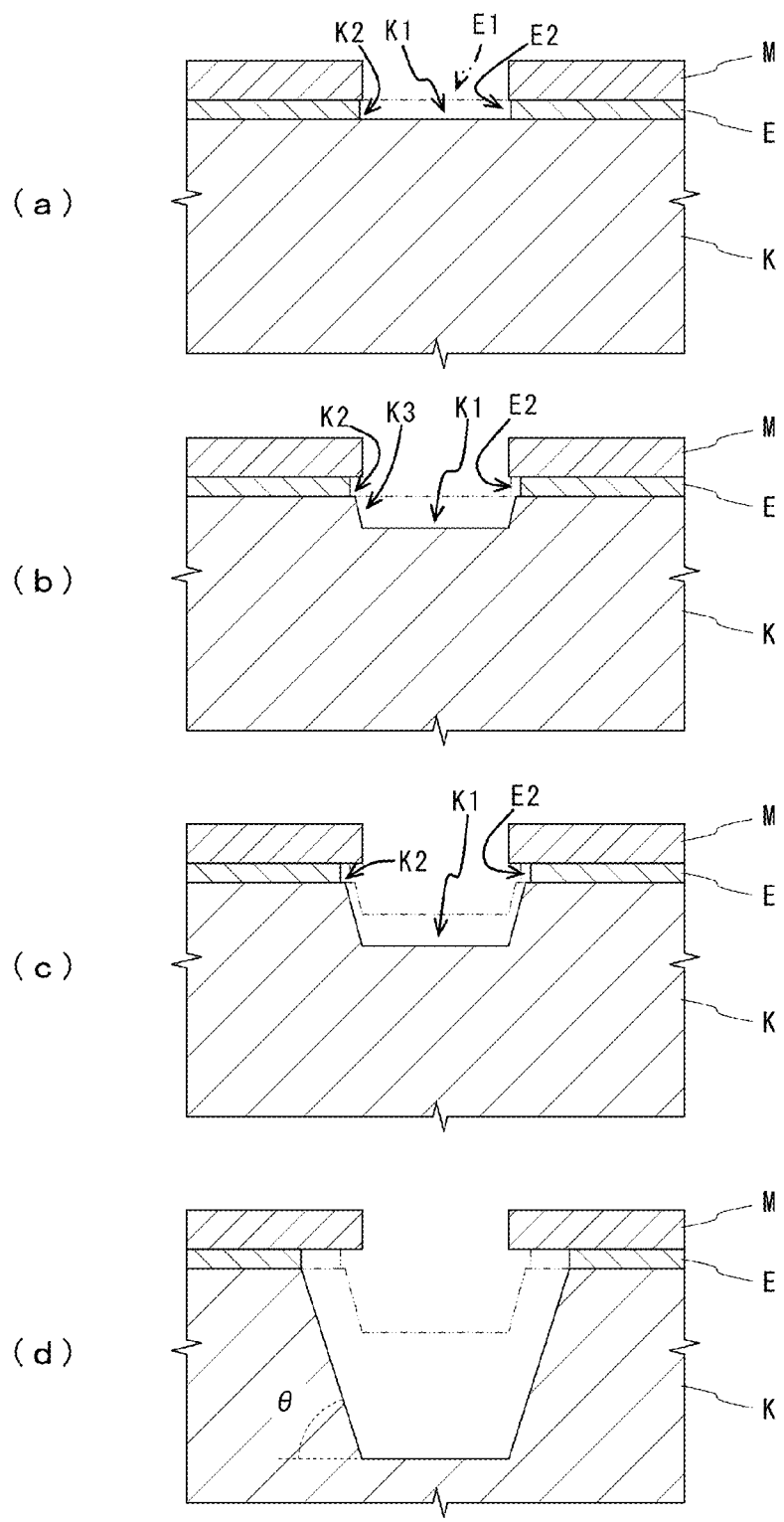
FIG. 1 shows cross-sectional views of a wide-gap semiconductor substrate for explaining a process of forming a tapered recess portion in the wide-gap semiconductor substrate.

Here, the process of forming a tapered recess portion in the silicon carbide substrate K is described in detail below with reference to FIG. 1.

First, as shown in FIG. 1(a), the E1 portion of the high speed etching film E is etched by sputtering by the ions and chemical reaction with the reactive species, the ions and the reactive species being generated by the generation of plasma from the reactive etching gas, and the E2 portion of the high speed etching film E is etched by chemical reaction with the reactive species. Thereby, the K1 portion of the silicon carbide substrate K is exposed and the K2 portion located under the mask is also exposed.

Subsequently, as shown in FIG. 1(b), the K1 portion of the silicon carbide substrate K exposed by the etching of the E1 portion of the high speed etching film E is etched by sputtering by the ions and chemical reaction with the reactive species, and because the etching speed of the high speed etching film E is higher than that of the silicon carbide substrate K, the E2 portion is etched more quickly than the K3 portion, which is a side wall of the silicon carbide substrate. Thereby, the K2 portion of the silicon carbide substrate K is further exposed and the reactive species enter between the K2 portion and the mask M, and chemical reaction between the reactive species and the silicon carbide causes isotropic etching of the K2 portion to proceed.

Thereafter, as shown in FIG. 1(c), the K1 portion of the silicon carbide substrate K is etched in the depth direction in a similar manner. Further, etching of the E2 portion of the high speed etching film E proceeds in the horizontal direction along the mask M, and thereby the K2 portion covered by the high speed etching film E is gradually exposed and a clearance is generated between the K2 portion and the mask M, and the reactive species enters the clearance and come into contact with the K2 portion, and thereby the K2 portion is gradually etched isotropically by chemical reaction with the reactive species.

As the K2 portion of the silicon carbide substrate K is etched, the K1 portion is also etched, and finally a tapered recess portion (etching structure) is formed as shown in FIG. 1(d).

Figure 3:
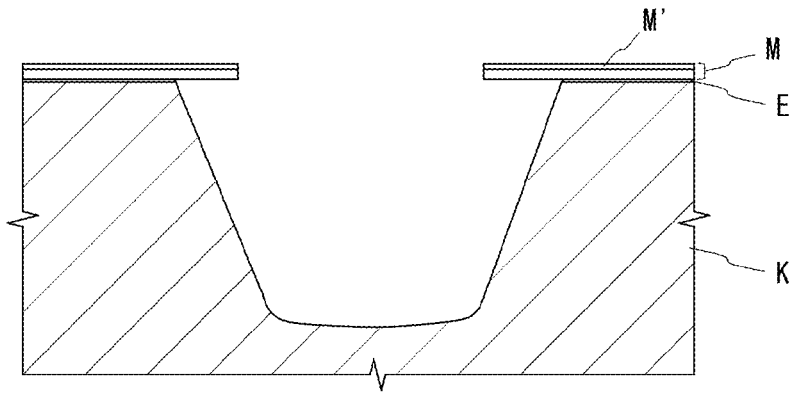
FIG. 3 shows a cross-sectional view of a silicon carbide substrate having a high speed etching film comprising titanium formed thereon when it was etched by the plasma etching method according to the one embodiment of the present invention.

In this connection, FIG. 3 shows a cross-sectional view of the silicon carbide substrate K etched by the plasma etching method according to this embodiment, wherein gas mixture of $SF_6$ gas and $O_2$ gas is used as the reactive etching gas, and the supply flow rates of $SF_6$ gas and $O_2$ gas are 200 sccm and 20 sccm, respectively, the high-frequency power supplied to the coils 26 is 2000 W, the high-frequency power supplied to the platen 15 is 200 W, and the pressure inside the processing chamber 11 is 12 Pa. This silicon carbide substrate K has s titanium film having a film thickness of 0.1 μm formed as the high speed etching film E on the surface thereof and a nickel film having a film thickness of 6 μm formed as the mask M on the titanium film, and about 2 μm of the mask surface, which is indicated by M', is modified by the etching processing. As shown in FIG. 3, actually, it is possible to form a tapered recess portion in the silicon carbide substrate K by performing the etching processing in accordance with the plasma etching method according to this embodiment.

Thus, in the plasma etching method of this embodiment, because the high speed etching film E comprising a material which is more easily etched at a higher speed than the silicon carbide substrate K is formed between the silicon carbide substrate K and the mask M, a clearance is generated between the silicon carbide substrate K and the mask M by etching of the high speed etching film E, and the reactive species such as radicals enter the clearance and etching proceeds there, which enables a tapered recess portion to be formed in the silicon carbide substrate K.

Figure 4:
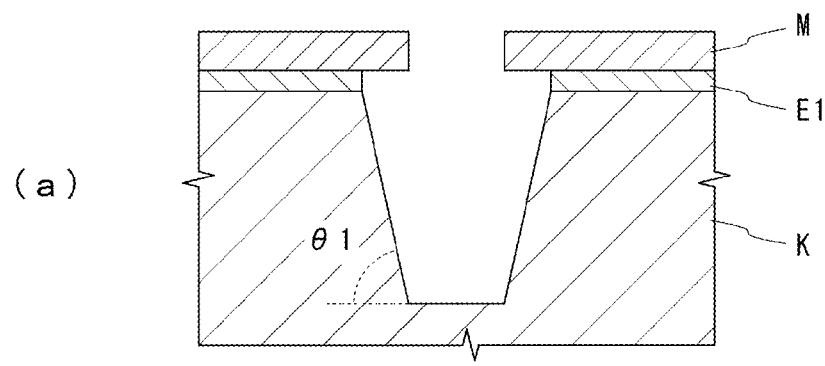
FIG. 4 shows cross-sectional views of a silicon carbide substrate for explaining the relationship between the etching speed of a high speed etching film and the taper angle of a tapered recess portion formed in the silicon carbide substrate.
Figure 4:
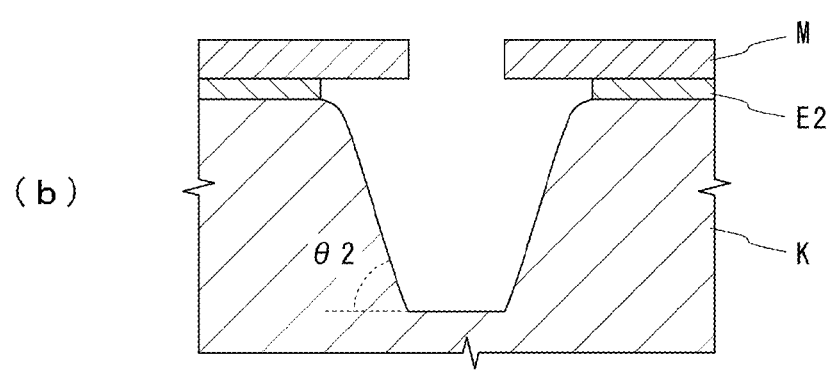

Further, FIG. 4 schematically shows the shapes of recess portions formed in the silicon carbide substrate K in a case where the ratio of the etching speed of the silicon carbide substrate K to the etching speed of the high speed etching film E is changed by using a different material as the high speed etching film E. E1 of FIG. 4(a) and E2 of FIG. 4(b) are high speed etching films E which are different from each other in the material and the etching speed of E2 shall be higher than that of E1. As shown in FIG. 4, when etching the silicon carbide substrate K having the high speed etching film E1 formed thereon, the taper angle of a formed tapered recess portion is θ1, whereas when etching the silicon carbide substrate K having the high speed etching film E2 formed thereon, the taper angle of a formed tapered recess portion is θ2 which is smaller than θ1. That is to say, changing the material of the high speed etching film E makes it possible to change the taper angle of a tapered shape formed in a recess portion.

Figure 5:
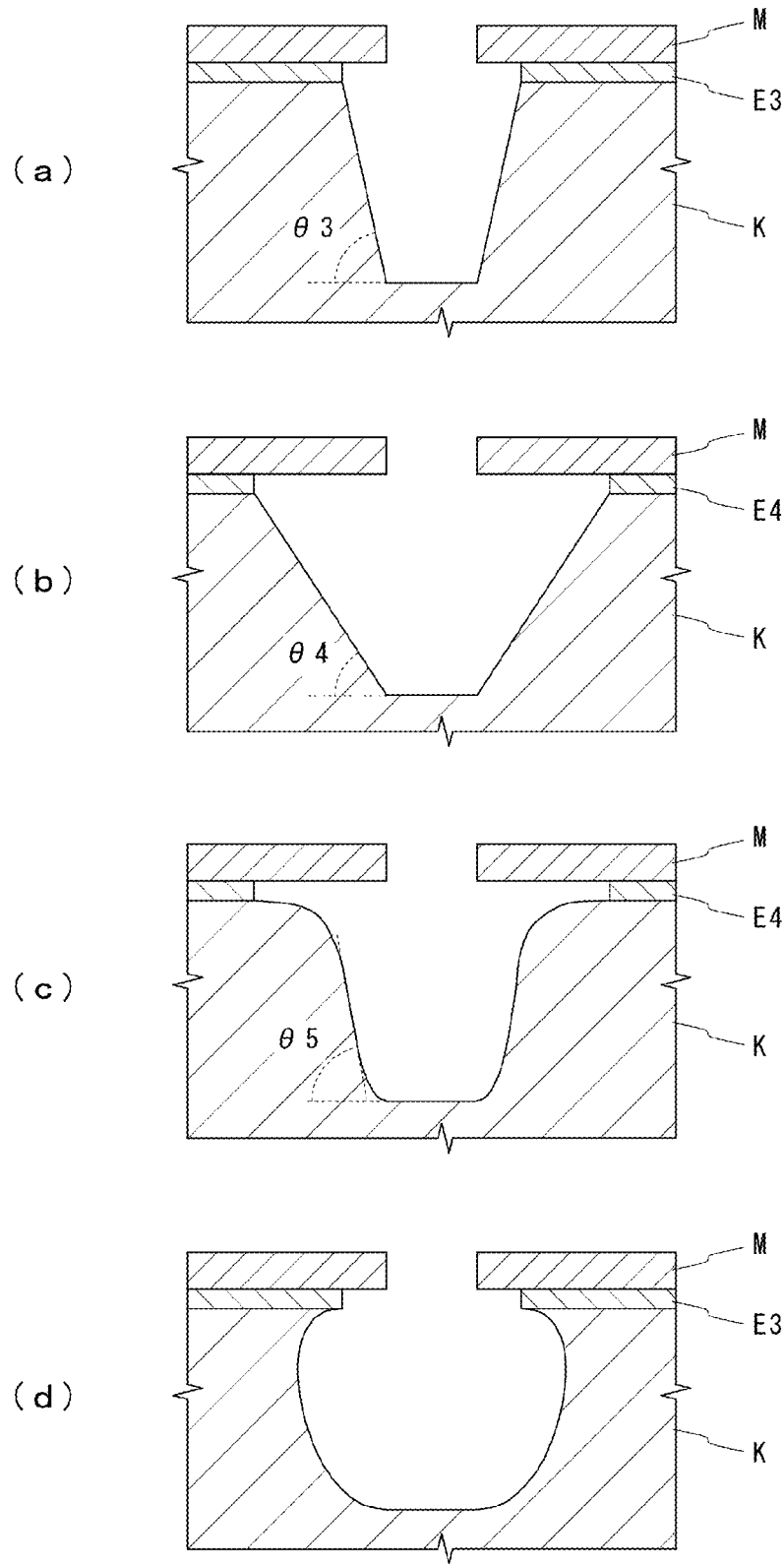
FIG. 5 shows cross-sectional views of a wide-gap semiconductor substrate for explaining the relationship between the etching speeds of a silicon carbide substrate and a high speed etching film and the shape of a recess portion formed in the silicon carbide substrate.

Furthermore, changing the etching speed of the silicon carbide substrate K and the etching speed of the high speed etching film E makes it possible to change the shape of a recess portion formed in the silicon carbide substrate K, and determining the etching speeds as appropriate makes it possible to obtain a desired shape. This principle is described below with reference to FIG. 5. FIG. 5 schematically shows the shapes of recess portions formed in a case where the etching speed of the silicon carbide substrate K and the etching speed of the high speed etching film E are changed and the etching processing is performed for the same period of time. The etching speed of the high speed etching film E can be changed by changing the material of the high speed etching film E and the etching speed of the silicon carbide substrate K can be changed by changing the temperature to which the silicon carbide substrate K is heated at the time of the etching processing.

FIG. 5(a) shows the shape of a recess portion formed in a case where the etching processing is performed on the silicon carbide substrate K having the high speed etching film E3 formed thereon the etching speed of which is a1 after heating the silicon carbide substrate K so that the etching speed of the silicon carbide substrate K is b1, wherein a1 is higher than b1 and a1/b1 being the speed ratio is r1. FIG. 5(b) shows the shape of a recess portion formed in a case where the etching processing is performed on the silicon carbide substrate K having the high speed etching film E4 formed thereon the etching speed of which is a2 higher than a1 after heating the silicon carbide substrate K so that the etching speed of the silicon carbide substrate K is b2 higher than b1, wherein a2 is higher than b2 and a2/b2 being the speed ratio is r1. As shown in FIGS. 5(a) and 5(b), although a tapered recess portion having a linear upper portion is formed in both cases, the taper angle is θ3 in FIG. 5(a) and is θ4 smaller than θ3 in FIG. 5(b), and the taper angle becomes smaller as the etching speeds of the silicon carbide substrate K and the high speed etching film E become higher. That is to say, in a case of changing both the etching speed of etching the high speed etching film E and the etching speed of etching the silicon carbide substrate K while maintaining the etching speed ratio, it is possible to form a linear tapered recess portion having a different taper angle.

FIG. 5(c) shows the shape of a recess portion formed in a case where the etching processing is performed on the silicon carbide substrate K having the high speed etching film E4 formed thereon the etching speed of which is a2 after heating the silicon carbide substrate K so that the etching speed of the silicon carbide substrate K is b1, wherein a2 is higher than b1 and a2/b1 being the speed ratio is r2 larger than r1. In this case, as shown in FIG. 5(c), the taper angle of the formed tapered recess portion is θ5, the recess portion has a shape in which the upper end side of the side wall thereof is round and an upper end portion of the side wall expands to the outside. That is to say, in a case where the etching speed ratio of the high speed etching film E to the silicon carbide substrate K is larger than a predetermined value, it is possible to form a tapered recess portion having a shape in which the upper end side of the side wall thereof is round and a upper end portion of the side wall expands to the outside.

It is noted that, as a comparative example, FIG. 5(d) shows the shape of a recess portion formed in a case where the etching processing is performed on the silicon carbide substrate K having the high speed etching film E3 formed thereon the etching speed of which is a1 after heating the silicon carbide substrate K so that the etching speed of the silicon carbide substrate K is b2 higher than a1. In this case, as shown in FIG. 5(d), there is a tendency that the formed recess portion has a bowing shape.

As described above, in the plasma etching method according to this embodiment, by changing the etching speed of the high speed etching film E or by changing the etching speed of the high speed etching film E and the etching speed of the silicon carbide substrate K, it is possible to control the taper angle of a formed recess portion from about 45° to 90°, and it is also possible to change the shape thereof.

(Second Embodiment)

Next, another embodiment of the present invention is described. Here, it is explained that the taper angle of the side wall at the time of etching can be controlled by changing deposition conditions for depositing the high speed etching film E.

In this embodiment, a silicon nitride film (SiN) is employed as the high speed etching film E. The reason for using a silicon nitride film as the high speed etching film E is that the speed of etching of it by reactive species is not too high and that the speed of etching of it by reactive species can be easily controlled by changing deposition conditions.

Although the high speed etching film E is deposited by the CVD method in this embodiment, this is merely an example. A CVD device, which is not specifically shown in the drawings, has, for example, a process chamber, a stage which is disposed in the process chamber and on which a silicon carbide substrate K is placed, a first power supply unit applying high-frequency power (for example, 13.56 MHz) to the process chamber and the stage as electrodes, a second power supply unit supplying low-frequency power (for example, 380 kHz) to the electrodes, a gas supply section supplying $SiH_4$ gas and $NH_3$ gas as source gases for deposition and $N_2$ gas as a carrier gas into the process chamber, and a pressure adjusting section adjusting the pressure inside the process chamber. It is noted that the device may have one of the first and second power supply units.

Using this CVD device, the supply flow rates of $SiH_4$ gas, $NH_3$ gas and $N_2$ gas, the high-frequency power, the low-frequency power, and the pressure inside the process chamber were set in accordance with Deposition condition 1 to Deposition condition 4 shown in FIG. 6, and a silicon nitride film having the thickness of 0.5 μm was formed on a SiC substrate K under each of the Deposition conditions 1 to 4. Subsequently, after forming a mask on each SiC substrate K, each SiC substrate K was etched using the etching apparatus 1 shown in FIG. 2, wherein the temperature of the SiC substrate K was about 310° C., the supply flow rate of $SF_6$ gas was 200 sccm, the supply flow rate of $O_2$ gas was 20 sccm, the high-frequency power supplied to the coils 26 was 2000 W, the high-frequency power supplied to the platen 15 was 200 W, and the pressure inside the processing chamber 11 was 12 Pa. It is noted that the temperature of the SiC substrate K was measured using a non-contact temperature sensor (IT-450 series) made by Horiba Ltd.

In this connection, the refractive index of the silicon nitride film as high speed etching film which was formed on the SiC substrate K and the taper angle of a side wall formed by the etching are shown in FIG. 6. In FIG. 6, each of the Deposition conditions 1 to 4 comprises, from the left, $SiH_4$ flow rate (sccm), $NH_3$ flow rate (sccm), $N_2$ flow rate (sccm), Pressure inside process chamber (Pa), High-frequency power HF (W), and Low-frequency power LF (W). It is noted that, in the Deposition conditions 2 to 4, the proportion of the $SiH_4$ flow rate to the $NH_3$ flow rate is gradually increased. It is noted that the refractive index was measured using a publicly known laser type refractive index measuring device.

As shown in FIG. 6, under the Deposition conditions 1 to 4, the refractive index of the silicon nitride film (SixNy) is changed between 1.882 and 2.600 in accordance with the composition ratio of Si to N (x:y). On the other hand, it is known that the refractive index of a silicon nitride film having an ideal SiN bond ($Si_3N_4$) is about 1.9. Therefore, it is conceivable that a film having a low refractive index value which is near 1.9 (for example, the films formed under the Deposition conditions 1 and 2) has a composition near the ideal SiN bond ($Si_3N_4$) and its atoms are firmly bonded to each other. On the other hand, it is conceivable that a film having a high refractive index value (for example, the films formed under the Deposition conditions 3 and 4) has a composition including more Si than the ideal SiN bond ($Si_3N_4$) (Si-rich), and therefore has many insufficient bonds between atoms, and therefore such a film can be easily etched.

That is, a silicon nitride film which has a high refractive index value and is Si-rich and which is considered to have a composition closer to a-Si has weak interatomic bonds and therefore can be easily etched, and therefore the etching speed of such a silicon nitride film is higher. Thus, the refractive index of a silicon nitride film is an index of the easiness of etching and the etching speed thereof.

As explained using FIG. 5 in the foregoing embodiment, when forming a linear tapered recess portion, the taper angle of a side wall at the time of etching is smaller as the etching speed of the high speed etching film E and the etching speed of the silicon carbide substrate K are higher. In accordance with this principle, in FIG. 6, there is clearly shown a tendency that the taper angle of a side wall at the time of etching is small when a silicon nitride film which has a high refractive index value and the etching speed of which is high is used as the high speed etching film E.

Thus, changing the deposition conditions for depositing a silicon nitride film as the high speed etching film E makes it possible to adjust the etching speed of the silicon nitride film and thereby control the taper angle of a side wall at the time of etching. For example, as described above, in a case where the high speed etching film E is a silicon nitride film, setting the deposition conditions to Si-rich makes the silicon nitride film easier to etch and thereby makes the etching speed of the silicon nitride film higher, thereby making the taper angle of a side wall at the time of etching smaller.

Thus, on the basis of the correlation between the deposition conditions, the film quality of a silicon nitride film (high speed etching film) deposited under the deposition conditions and the taper angle of an etched side wall depending on the film quality, it is possible to set deposition conditions corresponding to the taper angle of a side wall to be formed in the etching step, and depositing a silicon nitride film under such deposition conditions in the deposition step can make a side wall formed in the etching step have a desired taper angle.

Further, as described above, the film quality of a silicon nitride film can be evaluated on the basis of its refractive index. Therefore, it is possible to set deposition conditions which enables deposition of a silicon nitride film having a film quality, in other words, a refractive index, corresponding to the taper angle of a side wall to be formed in the etching step, and depositing a silicon nitride film under such deposition conditions in the deposition step makes it possible to deposit a high speed etching film having a desired refractive index, and accordingly it is possible to make a side wall to be formed in the etching step have a desired taper angle.

It is noted that the material of the high speed etching film E the etching speed of which can be adjusted by changing the deposition conditions is not limited to silicon nitride and various film materials, such as an a-Si film, a poly-Si film and a WSi film, may be used. It is noted that, as for a film which does not transmit light, as described above, it is not possible to check the refractive index thereof and refer to it as index of the etching speed.

Further, although, in FIG. 6, the etching speed of a silicon nitride film is adjusted by changing the ratio of the $SiH_4$ flow rate (sccm) to the $NH_3$ flow rate (sccm) as the Deposition conditions 1 to 4, the etching speed of a silicon nitride film can be also adjusted by changing the ratio of the $SiH_4$ flow rate (sccm) to the $N_2$ flow rate (sccm) instead of the Deposition conditions 1 to 4.

In the example shown in FIG. 6, the taper angle of a side wall at the time of etching varies between 53.7° and 67.2° in accordance with the Deposition conditions 1 to 4, the inventors succeeded in making the taper angle of side wall at the time of etching larger, for instance, 71.9°, 73.2°, 78.8°, 81.1°, or smaller, for instance, 42.1°, in an additional experiment in which the deposition conditions were further changed.

(Third Embodiment)

Next, a further embodiment of the present invention is described. Here, it is explained that it is possible to control the taper angle of a side wall at the time of etching by changing film thickness conditions of the high speed etching film E.

In this embodiment, an amorphous silicon (a-Si) film is employed as the high speed etching film E, but this is merely an example.

FIG. 7 shows the deposition time taken to deposit an amorphous silicon film on an SiC substrate and the taper angle of a side wall when performing etching using the amorphous silicon film as the high speed etching film E, wherein the film thickness of the amorphous silicon film varies between 0 and 0.5 μm.

The deposition conditions for forming an amorphous silicon film in FIG. 7 are fixed, wherein the supply flow rate of $SiH_4$ gas is 90 sccm, the supply flow rate of Ar gas is 90 sccm, the supply flow rate of $N_2$ gas is 0 sccm, the pressure inside the process chamber is 130 Pa, the high-frequency power HF is 0 W, and the low-frequency power LF is 200 W. In FIG. 7, the film thickness of the amorphous silicon film is adjusted by changing the deposition time. Further, the etching conditions are the same as those in the second embodiment.

As shown in FIG. 7, as the film thickness of the amorphous silicon film as the high speed etching film E becomes larger, the taper angle of a side wall at the time of etching becomes smaller. Based on this finding, it is conceivable that the taper angle of a side wall at the time of etching can be controlled also by adjusting the film thickness of the high speed etching film E.

It is conceivable that the reason therefor is that a space formed between the top surface of the SiC substrate K and the mask by etching the high speed etching film E becomes larger as the film thickness of the high speed etching film E becomes larger, and therefore reactive species more easily enter the space and isotropic etching of the SiC substrate K there proceeds more, and thereby the taper angle of a side wall is made small.

Therefore, making the high speed etching film E have a film thickness set corresponding to the taper angle of a side wall to be formed in the etching step can make a side wall formed in the etching step have a desired taper angle.

Thus, embodiments of the present invention have been described, but a specific mode in which the present invention can be realized is not limited thereto.

Although in the above embodiments, the plasma generating device 25 has the coils 26 vertically aligned on the outer periphery of the upper chamber 12, the configuration thereof is not limited thereto and the plasma generating device 25 may have a configuration in which the coils 26 are disposed outside the upper chamber 12 (for example, above a top plate of the upper chamber 12), for example.

For example, although $SF_6$ gas or a gas mixture of $SF_6$ gas and $O_2$ gas is used as the reactive etching gas in the above embodiments, the reactive etching gas is not limited thereto, and another fluorine-containing gas, e.g., $CF_4$ gas, may be used, or a chlorine-containing gas, e.g., $Cl_2$ and $BCl_3$ may be used for etching. It is noted that, in a case where etching is performed using a chlorine-containing gas, besides the above-mentioned titanium-containing materials and silicon-containing materials, aluminum-containing materials, such as pure aluminum (Al) and aluminum-silicon type (Al—Si), also may be preferably used as the material of the high speed etching film.

The invention claimed is:

1. A plasma etching method of plasma etching a wide-gap semiconductor substrate having at least a wide-gap semiconductor layer and placed on a platen arranged in a processing chamber using a plasma generated from a reactive etching gas, comprising:
    a deposition step of forming a high speed etching film directly on a surface of the wide-gap semiconductor layer, the high speed etching film comprising a component which is etched at a higher speed than a component of the wide-gap semiconductor layer by reactive species generated by generating the plasma from the reactive etching gas,
    a mask forming step of forming a mask having an opening on the high speed etching film formed on the surface of the wide-gap semiconductor substrate; and
    an etching step of placing the wide-gap semiconductor substrate on the platen arranged in the processing chamber, heating the wide-gap semiconductor substrate to a temperature equal to or higher than 200 ° C., and supplying the reactive etching gas into the processing chamber to generate the plasma and applying a bias potential to the platen on which the wide-gap semiconductor substrate is placed, thereby etching, through the opening, the high speed etching film and the wide-gap semiconductor layer by the plasma generated from the reactive etching gas,
    the etching step of etching the high speed etching film through the opening to expose the wide-gap semiconductor layer and then etching the wide-gap semiconductor layer while further etching the high speed etching film to expose a portion located under the mask of the wide-gap semiconductor layer, thereby forming a tapered etching structure in the wide-gap semiconductor layer.

2. The plasma etching method according to claim 1, in which the high speed etching film comprises at least one of titanium, titanium nitride, amorphous silicon, polysilicon, tungsten silicide and silicon nitride.

3. The plasma etching method according to claim 1, in which the wide-gap semiconductor substrate is a substrate comprising silicon carbide.

4. The plasma etching method according to claim 1, in which the reactive etching gas is a fluorine-containing gas.

5. The plasma etching method according to claim 1, in which the deposition step is performed by a vapor deposition, and, in the deposition step, a deposition condition is set so that the high speed etching film is deposited with a film quality which allows a side wall surface of an etching structure formed in the etching step to have a desired angle to a bottom surface thereof, and the high speed etching film is deposited under the set deposition condition, the deposition condition being set based on a correlation between the deposition condition, the film quality of the high speed etching film, and the angle of the side wall surface to the bottom surface of the etching structure formed in the etching step, where the film quality changes in accordance with the deposition condition and the angle is smaller when the high speed etching film is easier to etch.

6. The plasma etching method according to claim 5, in which the deposition condition includes at least one of a supply flow rate of a source gas for deposition supplied into a process chamber, a supply flow rate of a carrier gas supplied into the process chamber, a pressure inside the process chamber, and a power applied to electrode.

7. The plasma etching method according to claim 1, in which:

the high speed etching film comprises at least one of amorphous silicon, polysilicon, tungsten silicide and silicon nitride, and the deposition step is performed by a vapor deposition, and the high speed etching film is deposited under a deposition condition which is set so that the high speed etching film has a predetermined refractive index.

8. The plasma etching method according to claim 7, in which the deposition condition includes at least one of a supply flow rate of a source gas for deposition supplied into a process chamber, a supply flow rate of a carrier gas supplied into the process chamber, a pressure inside the process chamber, and a power applied to electrode.

9. The plasma etching method according to claim 1, in which the deposition step is performed by a vapor deposition, and, in the deposition step, a film thickness condition is set so that the high speed etching film is deposited with a film thickness which allows side wall surface an etching structure formed in the etching step to have a desired angle to a bottom surface thereof, and the high speed etching film is deposited under the set film thickness condition, the film thickness condition being set based on a correlation between the film thickness condition, the film thickness of the high speed etching film, and the angle of the side wall surface to the bottom surface of the etching structured formed in the etching step, where the film thickness changes in accordance with the film thickness condition and the angle is smaller when the film thickness is thicker.

* * * * *